(12) United States Patent
Dunworth (10) Patent No.: US 7,113,052 B2
(45) Date of Patent: Sep. 26, 2006

(54) COARSE FREQUENCY TUNING IN A VOLTAGE CONTROLLED OSCILLATOR

(75) Inventor: Jeremy D. Dunworth, San Diego, CA (US)

(73) Assignee: QualComm, Incorporated, San Diego, CA (US)

( * ) Notice: Subject to any disclaimer, the term of this patent is extended or adjusted under 35 U.S.C. 154(b) by 45 days.

(21) Appl. No.: 11/046,261

(22) Filed: Jan. 28, 2005

(65) Prior Publication Data

US 2006/0170511 A1 Aug. 3, 2006

(51) Int. Cl.
*H03B 5/00* (2006.01)
*H03B 5/12* (2006.01)

(52) U.S. Cl. .................. 331/179; 331/177 V (58) Field of Classification Search .............. 331/36 C, 331/108 D, 117 R, 117 FE, 117 D, 177 R, 331/177 V, 179
See application file for complete search history.

(56) References Cited

U.S. PATENT DOCUMENTS 6,606,004 B1 * 8/2003 Staszewski et al. ........... 331/17

OTHER PUBLICATIONS

Baginski et al.; D/A/ Converters and Filters; A Complete 18-Bit Audio D/A Converter; ISSCC 90 (Feb. 1990); pp. 202-296.
Fichtel et al.; D/A/ Converters and Filters; A BiCMOS Analog Adaptive Filter; ISSCC 90 (Feb. 1990); pp. 204-296.
Vandenbussche et al.; A 14b 150MSample/s Update Rate $Q^2$ Random Walk CMOS DAC; ISSCC99/Session 8/Paper TA 8.1 (1999); pp. 146-147.
Bugeja et al.; A Self-Trimming 14-b 100-MS/s CMOS DAC; IEEE Journal of Solid-State Circuits, vol. 35, No. 12 (Dec. 2000); pp. 1841-1852.
Wikner et al; Characteristics of Linear-Coded D/A/ Converters; IEEE (2000); pp. 67-72.
Wikner et al; D/A Conversion With Linear-Coded Weights; IEEE (2000); pp. 61-66.
Van den Bosch et al; A 12b 500MSample/s Current-Steering CMOS D/A Converter; ISSCC 2001/Session 23/Analog Techniques/23.5 (2001); pp. 366-400.
Gonzalez et al.; Clock-Jitter Induced Distortion in High Speed CMOS Switched-Current Segmented Digital-to-Analog Converters; IEEE (2001); pp. I-512-I-515.

* cited by examiner

*Primary Examiner*—David Mis
(74) *Attorney, Agent, or Firm*—Philip R. Wadsworth; Charles D. Brown; Todd Marlette (57) ABSTRACT

Methods and apparatus are presented for performing coarse frequency tuning in a voltage controlled oscillator. The methods and apparatus are directed towards the use of a new voltage controlled oscillator comprising both a binary coding module and a thermometer coding module. The combination of the binary coding module and the thermometer coding module control a capacitance corresponding to a resonant tank which is used to coarse tune the frequency of the voltage controlled oscillator.

22 Claims, 4 Drawing Sheets

COARSE FREQUENCY TUNING IN A VOLTAGE CONTROLLED OSCILLATOR

BACKGROUND

I. Field

The disclosed embodiments relate to the field of voltage controlled oscillators.

II. Background

A cellular telephone or other wireless communication device transmits and receives signals at specific frequencies. One or more voltage controlled oscillators, commonly referred to as VCOs, are typically used to set or establish desired transmit and/or receive frequencies. One basic type of VCO design is that of an inductor-capacitor (LC) resonant tank VCO.

In an LC resonant tank VCO, one common way by which the frequency is set, entails utilizing a set of metal-insulator-metal capacitors (MIMcaps) which can be switched on and off. By selectively switching MIMcaps, the center frequency of the VCO can be coarse tuned. Furthermore, MIMcaps confer improved compensation for process variation in the fabrication of VCOs. MIMcaps also provide a wider VCO frequency tuning range than would typically be available when a VCO is only implemented with traditional voltage variable capacitors (i.e., varactors). Moreover, using MIMcaps enables the VCO to have a lower tuning sensitivity, also called Kv, than is typically available when a VCO is only implemented with traditional varactors because the varactor elements can be smaller for the same VCO frequency tuning range.

When utilizing MIMcaps for tuning the frequency of an LC resonant tank VCO, there are typically two different MIMcaps configurations. One common configuration entails implementing the LC resonant tank VCO with a set of binary weighted MIMcaps. Specifically, the center frequency of the VCO can be coarse tuned or adjusted over a relatively wide range of frequencies simply by selectively controlling the binary weighting of the MIMcaps. Although this binary weighting scheme offers flexibility, versatility, adaptability, and scalability, it suffers in that it commonly results in suboptimal coverage over the entire VCO tuning frequency range. For example, with a binary weighted VCO implemented with a varactor (which is common practice), there are typically either gaps in the tuning frequency range where the varactor must cover a wider range of frequencies than desired or, conversely, there are overlaps whereby adjacent digital coarse frequency tuning settings are crowded too close together and the varactor is underutilized. In many instances, a binary weighted VCO exhibits both undesired gaps as well as overlaps across its respective frequency range. This disadvantage is virtually impossible to eliminate, given the realistic analog parasitics associated with the binary weighted scheme.

The other common MIMcaps configuration for tuning the frequency of an LC resonant tank VCO entails implementing the VCO with a thermometer coded MIMcaps tuning bank. Specifically, the center frequency of the VCO can be coarse tuned over a relatively wide range of frequencies simply by activating a specific number of MIMcap units, wherein each unit includes a similar amount of capacitance. Consequently, by using the thermometer coded scheme in VCOs, a more optimal spacing of digital coarse frequency tuning can be achieved. However, when extended to cover larger numbers of bits to support a wider frequency range, a thermometer coded MIMcap tuning bank requires a relatively large section of silicon. In other words, the thermometer coded MIMcap tuning bank may grow to consume a large area of a chip's limited silicon die area. This is highly disadvantageous because either the chip must be made larger or other functionalities must be compromised. In addition, the unavoidable parasitics resulting from the larger and larger biasing circuitry associated with implementing smaller thermometer MIMcap units would also grow correspondingly. Furthermore, the smaller thermometer MIMcap units also tend to result in net worse Q factor; the Q factor represents the quality factor of the LC resonant tank of the VCO. A lower Q factor directly translates into a degradation of the VCO phase noise and power consumption.

SUMMARY

Methods and apparatus are presented herein for performing coarse frequency tuning in a voltage controlled oscillator. The methods and apparatus are directed towards the use of a new voltage controlled oscillator comprising both a binary coding module and a thermometer coding module. The combination of the binary coding module and the thermometer coding module control a capacitance corresponding to a resonant tank which is used to coarse tune the frequency of the voltage controlled oscillator.

DETAILED DESCRIPTION

Reference will now be made in detail to embodiments, examples of which are illustrated in the accompanying drawings. It is understood that these specific embodiments are not intended to be limiting. In the following detailed description of the embodiments, numerous specific details are set forth in order to provide a thorough understanding of the embodiments. However, it will be evident to one of ordinary skill in the art that the embodiments may be practiced without these specific details. In other instances, well known methods, procedures, components, and circuits have not been described in detail as not to unnecessarily obscure aspects of the embodiments.

The word "exemplary" is used herein to mean "serving as an example, instance, or illustration." Any embodiment or design described herein as "exemplary" is not necessarily to be construed as preferred or advantageous over other embodiments or designs.

Figure 1:
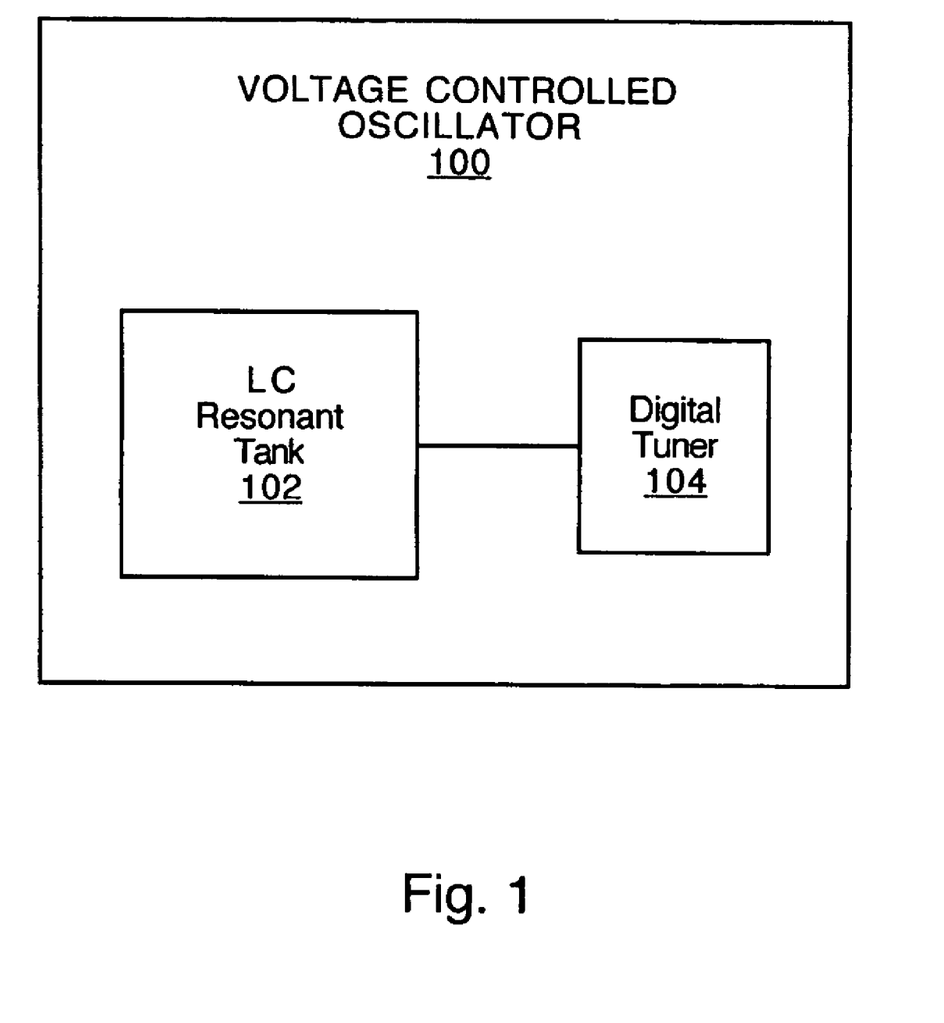
FIG. 1 is a block diagram of an embodiment directed towards a voltage controlled oscillator.

FIG. 1 is a block diagram of an exemplary voltage controlled oscillator 100 in accordance with embodiments. The voltage controlled oscillator 100 can be utilized in a wide variety of ways. For example, the voltage controlled oscillator 100 can be utilized as part of a transmitter, a receiver, and/or a transceiver of a wireless communication device, but is not limited to such. Specifically, in one embodiment the voltage controlled oscillator 100 can be implemented as part of a system that sets or establishes a transmit and/or receive frequency for wireless communication. The voltage controlled oscillator 100 can be implemented to include an inductor capacitor (LC) resonant tank 102 and a digital tuner 104, along with other circuitry not shown. The digital tuner 104 and the LC resonant tank 102 are coupled together such that the digital tuner 104 can transmit or issue control signals (e.g., a digital word) that adjust the capacitance of the LC resonant tank 102. Therefore, by adjusting the capacitance of the LC resonant tank 102, the digital tuner 104 is able to coarse tune the frequency of the voltage controlled oscillator 100.

It is noted that the coupling between the digital tuner 104 and the LC resonant tank 102 can be implemented as one or more bit lines or as one or more communication buses, but is not limited to such. It is appreciated that the digital tuner 104 can be implemented in a wide variety of ways. For example, the digital tuner 104 can be implemented with, but is not limited to, electronic hardware, software, or any combination thereof.

Figure 2:
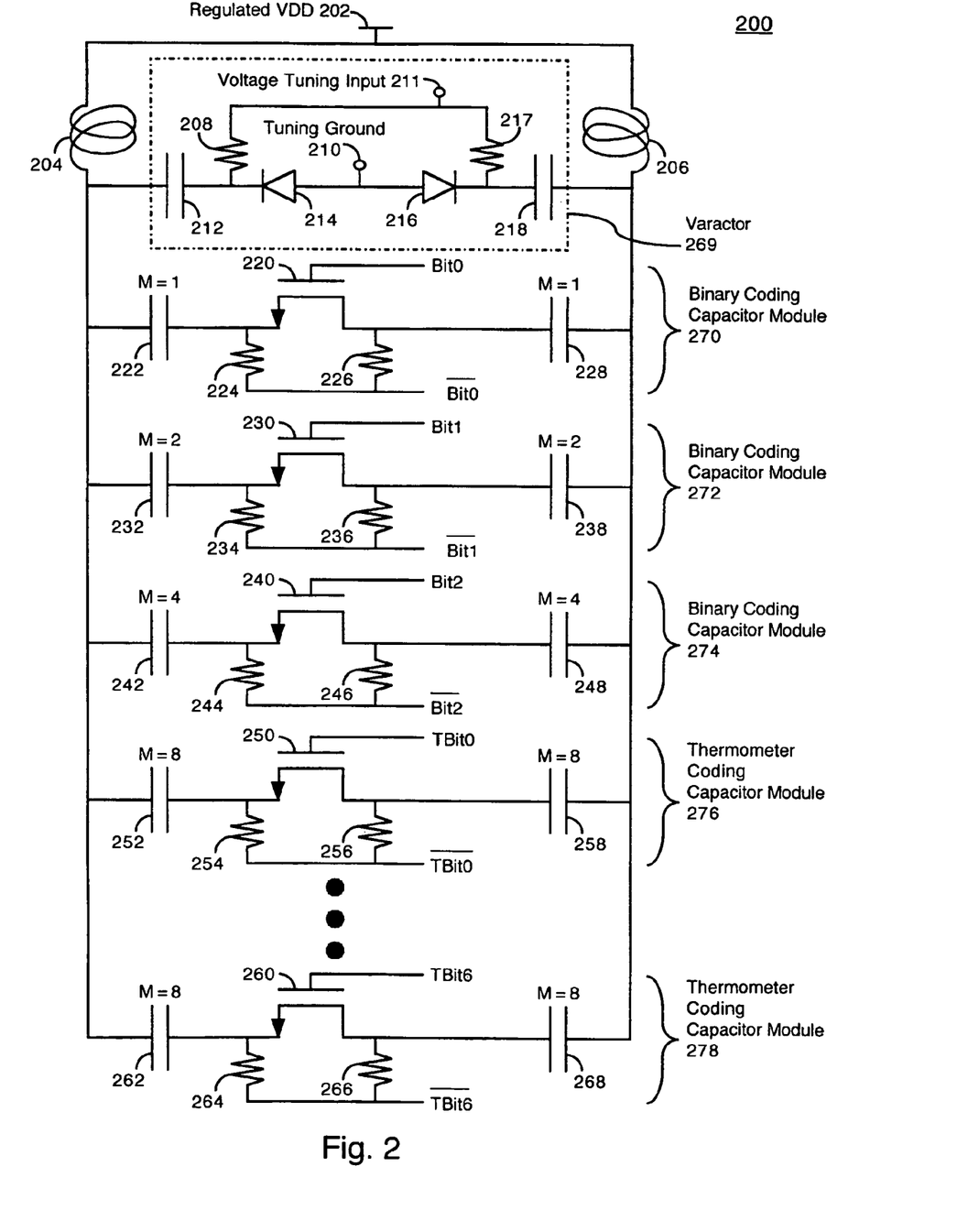
FIG. 2 is a schematic of an embodiment directed towards a resonant tank circuit.

FIG. 2 is a schematic of an exemplary LC resonant tank circuit 200 of a voltage controlled oscillator (e.g., 100) in accordance with embodiments. It is understood that the LC resonant tank circuit 200 can be used as an exemplary implementation for the LC resonant tank 102 of FIG. 1. In the present embodiment, the LC resonant tank circuit 200 utilizes binary coding and thermometer coding in order to digitally coarse tune the frequency of the VCO (e.g., 100). Specifically, the binary coding portion can include capacitor tuning elements that increment in size by an approximate factor of 2 and can be addressed by the digital tuner 104 using binary weighted code. The thermometer coding portion can include capacitor tuning elements that are nominally each of substantially equal unit size and can be addressed by the digital tuner 104 using a thermometer code. Within the present embodiment of the resonant tank 200, the binary coding can make up the least significant bits (LSBs) of the digital coarse tuning while the thermometer coding can make up the most significant bits (MSBs) of the digital coarse tuning, but are not limited to such.

The resonant tank 200 can be implemented to include any number of digital bits of binary coding and any number of digital bits of thermometer coding. For example, in the present embodiment the resonant tank 200 is implemented to include 64 digital course tuning codes with 3 digital bits of binary coding (corresponding to 8 settings) and 3 digital bits of thermometer coding (corresponding to 8 settings). It is appreciated that in one embodiment, the desired number of digital bits for the binary coding can be the same number of binary coding capacitor modules (e.g., 270, 272, and 274) that can be included as part of the resonant tank 200. Therefore, 3 digital bits of binary coding can equal 3 binary coding capacitor modules 270, 272, and 274. Additionally, in one embodiment, if "n" is the desired number of bits for the thermometer coding, then there can be $2^n-1$ thermometer coding capacitor modules (e.g., 276 and 278) included as part of the resonant tank 200. Therefore, 3 digital bits of thermometer coding can equal 7 thermometer coding capacitor modules 276 and 278 (where 5 thermometer modules are not shown).

Within FIG. 2, the "M" can represent the multiplicity factor related to capacitance. For example, a capacitor 232 having M=2 can represent two times the capacitance of a capacitor 222 having M=1. Additionally, a capacitor 242 having M=4 can represent two times the capacitance of the capacitor 232 having M=2. Therefore, in one embodiment when the digital tuner 104 activates the binary coding capacitor module 272, its resultant capacitance can be two times that produced when the digital tuner 104 activates the binary coding capacitor module 270. It is noted that within the present embodiment, the capacitance of each of the binary coding capacitor modules 270, 272, and 274 is incremented by a factor of 2. Additionally, the capacitance of each of the thermometer coding capacitor modules (e.g., 276 and 278) is substantially equal in size when activated by the digital tuner 104.

Within the resonant tank 200, note that the capacitance of the thermometer coding module 276 can be sized such that it is a factor of 2 larger than the capacitance of the binary coding module 274. As such, the capacitance of the thermometer coding module 276 can be equivalent to the next capacitance value associated with the binary coding of the binary coding modules 270, 272, and 274. In this manner, there can be a smooth transition throughout all of the 64 different capacitance settings of the resonant tank 200 which can be each associated with a unique digital word output by the digital tuner 104.

Specifically, Bit0, Bit1, and Bit2 of the present embodiment refer to binary coding bits of a digital word output by the digital tuner 104 and received by resonant tank 200. Furthermore, TBit0 through TBit6 refer to thermometer coding bits of the digital word output by the digital tuner 104 and received by resonant tank 200. The Bit0, Bit1, and Bit2 can be the three LSBs while TBit0 through TBit6 are the MSBs. It is understood that the binary coded modules 270, 272, and 274 can be directly addressed with a digital word transmitted by the digital tuner 104. However, the digital tuner 104 activates each of the thermometer coding modules (e.g., 276 and 278) in sequence via transmission of the digital word. Within the present embodiment, each bit of the thermometer code is equivalent to 8 times the capacitance of the binary coding module 270. For example, Table 1 below illustrates a sampling of decimal values from 0–63 along with their conversion into binary (e.g., that is separated into MSBs and LSBs) and also their conversion into VCO resonant tank code that includes both a binary code portion (e.g., as the LSBs) and a thermometer code portion (e.g., as the MSBs) which can be output by the digital tuner 104. Note that the combination of the binary code portion and the thermometer code portion of the VCO resonant tank code can be referred to as a digital word.

TABLE 1

| | Binary | | VCO Resonant Tank Code | |
|---|---|---|---|---|
| Decimal | MSBs | LSBs | MSB Thermometer Code | LSB Binary Code |
| 0 | 000 | 000 | 0000000 | 000 |
| 7 | 000 | 111 | 0000000 | 111 |
| 8 | 001 | 000 | 0000001 | 000 |
| 10 | 001 | 010 | 0000001 | 010 |
| 16 | 010 | 000 | 0000011 | 000 |
| 22 | 010 | 110 | 0000011 | 110 |
| 29 | 011 | 101 | 0000111 | 101 |
| 35 | 100 | 011 | 0001111 | 011 |
| 47 | 101 | 111 | 0011111 | 111 |
| 49 | 110 | 001 | 0111111 | 001 |
| 63 | 111 | 111 | 1111111 | 111 |

In the present embodiment, the LSB of the VCO resonant tank code corresponds to Bit0 while the MSB corresponds to TBit6. For example, as shown in Table 1, when the digital tuner 104 outputs a VCO resonant tank code "0000001 010" for the decimal number 10, Bit0 and Bit2 are set at a low voltage value (e.g., logic "0") while Bit1 is set at a high voltage value (e.g., logic "1"). Additionally, TBit0 is set at a high voltage (e.g., logic "1") while TBit1 through TBit6 are set at a low voltage (e.g., logic "0"). In response to receiving the VCO resonant tank code "0000001 010", the binary coding module 272 and the thermometer coding module 276 are active while the binary coding modules 270 and 274 along with the remaining thermometer coding modules (e.g., 278 and those not shown) are inactive.

Figure 3:
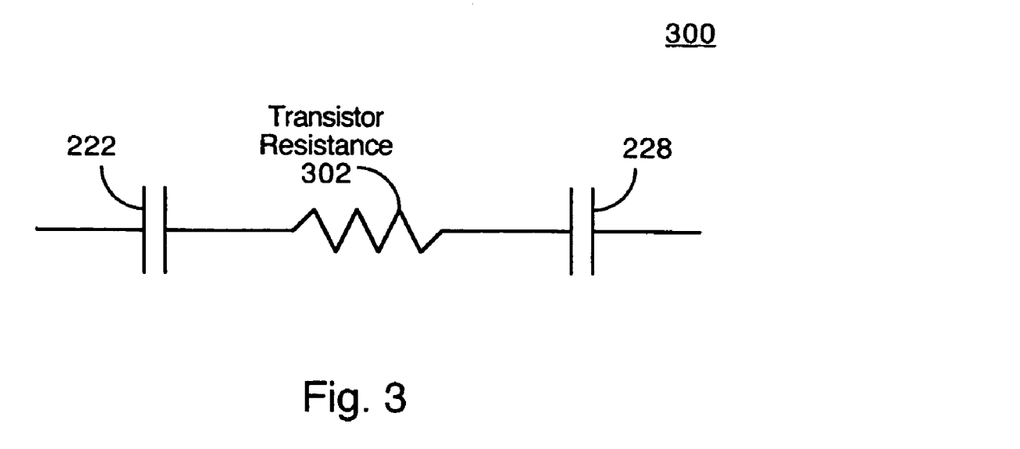
FIG. 3 is a schematic of an embodiment directed towards an electrical modeling circuit of a capacitor coding module of FIG. 2.

Within FIG. 2, the binary coding capacitor module 270 can include resistors 224 and 226, capacitors 222 and 228, along with a transistor 220. When Bit0 is set at a high voltage (e.g., logic "1"), then Bit0-bar is set at a low voltage (e.g., logic "0"). Therefore, the gate of the transistor 220 is set at a high voltage (e.g., logic "1") and the voltage at its drain and source is set at a low voltage (e.g., logic "0"). As such, the transistor 220 is switched on (or activated) so that it is conducting current. FIG. 3 is a schematic of an exemplary electrical modeling circuit 300 when the binary coding capacitor module 270 is activated in accordance with one embodiment. Specifically, when the binary coding module 270 is activated, the resultant electrical modeling circuit 300 includes capacitors 222 and 228 coupled in series with a resistance 302 that is associated with the transistor 220 (not shown) when it is conducting. Since the capacitance of each of the capacitors 222 and 228 is substantially the same, it is understood that the total capacitance of modeling circuit 300 is substantially equal to the capacitance of capacitor 222 (or capacitor 228) divided by 2.

Within FIG. 3, a first terminal of the capacitor 222 and a first terminal of the capacitor 228 are each coupled as shown in the resonant tank circuit 200. However, a second terminal of the capacitor 222 is effectively coupled with a first terminal of the transistor resistance 302. Additionally, a second terminal of the capacitor 228 is effectively coupled with a second terminal of the transistor resistance 302.

Figure 4:
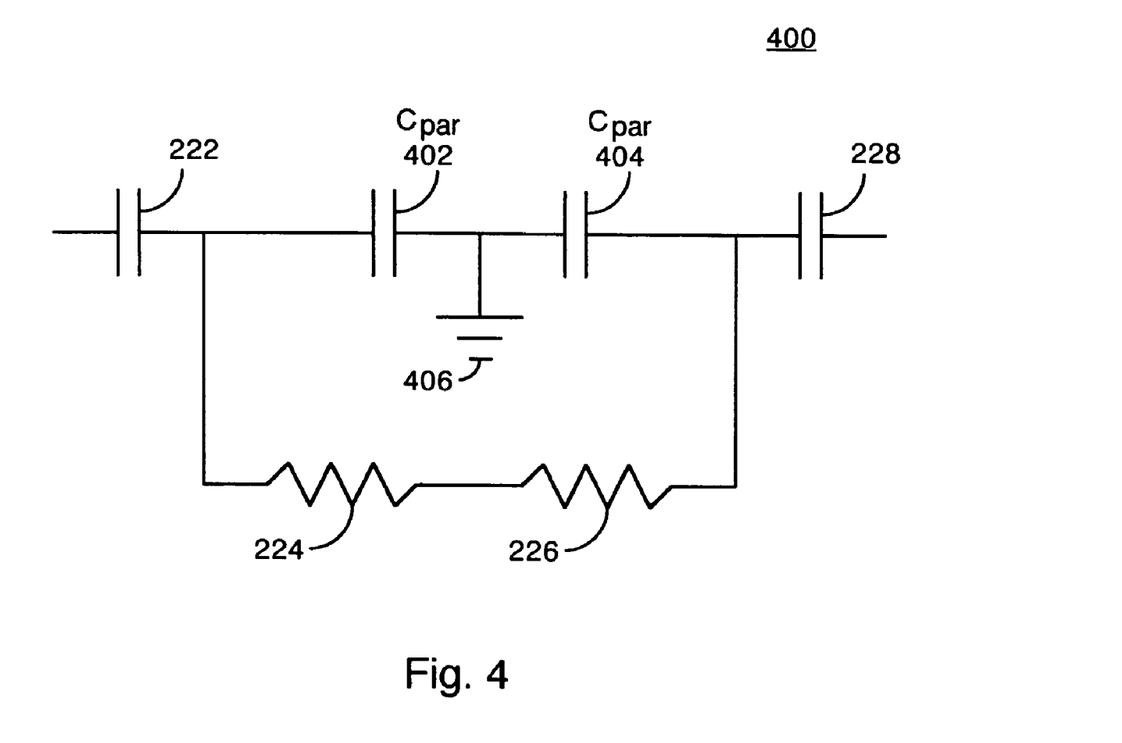
FIG. 4 is a schematic of another embodiment directed towards an electrical modeling circuit of a capacitor coding module of FIG. 2.

Conversely, within FIG. 2, when Bit0 is set at a low voltage (e.g., logic "0"), then Bit0-bar is set at a high voltage (e.g., logic "1"). Therefore, the gate of the transistor 220 is set at a low voltage (e.g., logic "0") and the voltage at its drain and source is set at a high voltage (e.g., logic "1") in order to minimize the parasitic capacitance associated with transistor 220. As such, the transistor 220 is switched off (or deactivated) so that it is effectively not conducting current. FIG. 4 is a schematic of an exemplary electrical modeling circuit 400 when the binary coding capacitor module 270 is deactivated in accordance with one embodiment. Specifically, when the binary coding module 270 is deactivated, the resultant electrical modeling circuit 400 includes capacitors 222 and 228 coupled in series with gate and junction parasitic capacitance ($C_{par}$) 402 and 404 and with ground 406. Note that the gate and junction parasitic capacitance 402 is associated with the source of the transistor 220 (not shown) while the gate and junction parasitic capacitance 404 is associated with the drain of the transistor 220. Since the capacitance of each of the capacitors 222 and 228 is substantially the same and that capacitance is so much greater than the capacitance of each of the parasitic capacitance 402 and 404, the effective result is a total capacitance much smaller than the total capacitance of the modeling circuit 300 (FIG. 3).

Within FIG. 4, the first terminals of the capacitors 222 and 228 can be coupled as described herein. The second terminal of the capacitor 222 is effectively coupled with a first terminal of a resistor 224 and a first terminal of the parasitic capacitance 402 of the transistor 220 (not shown). A second terminal of the parasitic capacitance 402 is effectively coupled with the ground 406 and a first terminal of the parasitic capacitance 404 of the transistor 220. A second terminal of the parasitic capacitance 404 is effectively coupled with the second terminal of the capacitor 228 and a second terminal of the resistor 226. A second terminal of the resistor 224 is coupled with the first terminal of the resistor 226.

It is understood that each of the binary coding capacitor modules 272 and 274 along with each of the thermometer coding capacitor modules 276 through 278 can operate in a manner similar to that described herein with reference to the binary coding capacitor module 270.

Within FIG. 2, by splitting the coarse tuning capacitors into a thermometer coded MSB bank (e.g., modules 276 through 278) and a binary coded LSB bank (e.g., modules 270–274), the LC resonant tank circuit 200 can achieve a desirable tradeoff between silicon area usage, design complexity, Q factor, and optimal tuning frequency coverage for the VCO 100. Note that the Q factor is the quality factor of the LC resonant tank 200. By implementing the thermometer coded modules (e.g., 276 through 278) as the MSBs, each MSB thermometer module capacitor size can be individually adjusted (or trimmed) away from its nominal unit value in order to provide a desired shift in the VCO 100 frequency after taking into account layout parasitics. This can result in easier optimization of the VCO 100 tuning frequency range and coverage of the thermometer coded tuning while retaining the area and Q factor qualities of the binary weighted tuning. Additionally, it can enhance the ease of designing the actual VCO (e.g., 100).

Specifically, using thermometer coded MSBs (e.g., modules 276 through 278) within the resonant tank 200 allows each thermometer coded unit element to be individually adjusted during the design phase to take into account systematic layout parasitics which cause non linearity in the capacitance vs. tuning code relationship. The optimization for systematic layout parasitics is easier to perform in the thermometer coded capacitors (e.g., 252, 258, 262, and 268) because each capacitor controls one capacitance step, unlike in the binary coded capacitors (e.g., 222, 228, 232, 238, 242, and 248) where the effective capacitance step size can be set by the systematic mismatch between the sum of all previous LSBs and the next LSB. In the binary coded capacitors, adjusting one capacitance step can also potentially change all other capacitance steps making optimization difficult.

Within FIG. 2, using the combination of binary and thermometer coded capacitors (e.g., modules 270–278) as part of the resonant tank 200 can allow maximum linearity of the capacitance step size vs. coarse tuning code. Within the resonant tank 200, this means that the size of the continuously variable analog capacitance, also known as a varactor 269, can be minimized. This minimizes the analog tuning sensitivity of the VCO 100, which is beneficial for VCO 100 phase noise performance.

Furthermore, using the combination of the binary and thermometer coded capacitors (e.g., modules 270–278) as part of the resonant tank 200 can confer better overall Q while maintaining good linearity. The easier optimization that results from using both binary and thermometer coded capacitors (e.g., modules 270–278) can also reduce the number of tuning bits utilized for the resonant tank 200.

The resonant tank circuit 200 of FIG. 2 can include the varactor 269 and inductors 204 and 206. The varactor 269 can be referred to as the continuously variable analog capacitance of the resonant tank 200. Within the present embodiment, the varactor 269 can include resistors 208 and 217, diodes 214 and 216, along with a tuning ground 210 and a voltage tuning input 211. A regulated voltage supply ($V_{DD}$) 202 can be coupled in the middle of the inductors 204 and 206 (which have substantially the same inductance). However, the regulated voltage supply 202 can be coupled in other ways. It is understood that the functionality of the varactor 269 is well know by those of ordinary skill in the art. Furthermore, the varactor 269 can be implemented in a wide variety of ways. For example, the varactor 269 can be implemented to include the diodes 214 and 216 while not including the resistors 208 and 217, the capacitors 212 and 218, and the tuning ground 210. Additionally, in this embodiment, the voltage tuning input 211 can be coupled between the input terminals of the diodes 214 and 216 while the output terminals of the diodes 214 and 216 can be coupled with the inductors 204 and 206, respectively.

Within the resonant tank 200, the resistors 224, 226, 234, 236, 244, 246, 254, 256, 264, and 266 can be implemented in a wide variety of ways. For example, note that the resistance (Z) of each of the resistors 244 and 246 of the binary coding module 274 can be implemented substantially the same. As such, the resistance of each of the resistors 254 and 256 of the thermometer coding module 276 can be substantially equal to Z/2. It is appreciated that the resistance of each of the resistors (e.g., 264 and 266) of the remaining thermometer coding modules (e.g., 278) can be substantially equal to Z/2. However, the resistance of each of the resistors 234 and 236 of the binary coding module 272 can be substantially equal to 2 times Z. Furthermore, the resistance of each of the resistors 224 and 226 of the binary coding module 270 can be substantially equal to 4 times Z. It is understood that the resistors 224, 226, 234, 236, 244, 246, 254, 256, 264, and 266 are not limited to the resistance values and relationships described herein.

It is noted that other voltage controlled oscillator topologies (or circuitry) can be utilized in combination with the binary coding circuitry (e.g., 270, 272, and/or 274) and the thermometer coding circuitry (e.g., 276 and/or 278) of the LC resonant tank circuit 200 of FIG. 2.

The binary coding capacitor module 272 can include resistors 234 and 236, capacitors 232 and 238, along with a transistor 230. Additionally, the binary coding capacitor module 274 can include resistors 244 and 246, capacitors 242 and 248, along with a transistor 240. The thermometer coding capacitor module 276 can include resistors 254 and 256, capacitors 252 and 258, along with a transistor 250. Furthermore, the thermometer coding capacitor module 278 can include resistors 264 and 266, capacitors 262 and 268, along with a transistor 260. It is understood that the binary coding capacitor modules 270–274 and the thermometer coding capacitor modules 276 and 278 can each be implemented in a wide variety of ways and is not limited to those embodiments described herein.

Within FIG. 2, the regulated voltage supply 202 can be coupled with the inductors 204 and 206. Specifically, a first terminal of the inductor 204 can be coupled with the regulated voltage supply 202 while a second terminal of the inductor 204 can be coupled with a first terminal of the capacitors 212, 222, 232, 242,252, and 262. Additionally, a first terminal of the inductor 206 can be coupled with the regulated voltage supply 202 while a second terminal of the inductor 206 is coupled with a first terminal of the capacitors 218, 228, 238, 248, 258, and 268. A second terminal of the capacitor 212 can be coupled with a first terminal of the resistor 208 and an output terminal of the diode 214. A second terminal of the resistor 208 can be coupled with a voltage tuning input 211 and a first terminal of the resistor 217 while the second terminal of the resistor 217 can be coupled to an output terminal of the diode 216 and a second terminal of the capacitor 218. An input terminal of the diode 214 can be coupled with the tuning ground 210 and can be also coupled with an input terminal of the diode 216.

A second terminal of the capacitor 222 can be coupled with a first terminal of the resistor 224 and the source of the transistor 220. A second terminal of the resistor 224 can be coupled with a first terminal of the resistor 226 and can be coupled with the digital tuner 104 in order to receive the Bit0-bar signal. A second terminal of the resistor 226 can be coupled with the drain of the transistor 220 and a second terminal of the capacitor 228. The gate of the transistor 220 can be coupled with the digital tuner 104 in order to receive the Bit0 signal.

Within FIG. 2, a second terminal of the capacitor 232 can be coupled with a first terminal of the resistor 234 and the source of the transistor 230. A second terminal of the resistor 234 can be coupled with a first terminal of the resistor 236 and can be coupled with the digital tuner 104 in order to receive the Bit1-bar signal. A second terminal of the resistor 236 can be coupled with the drain of the transistor 230 and a second terminal of the capacitor 238. The gate of the transistor 230 can be coupled with the digital tuner 104 in order to receive the Bit1 signal.

A second terminal of the capacitor 242 can be coupled with a first terminal of the resistor 244 and the source of the transistor 240. A second terminal of the resistor 244 can be coupled with a first terminal of the resistor 246 and can be coupled with the digital tuner 104 in order to receive the Bit2-bar signal. A second terminal of the resistor 246 can be coupled with the drain of the transistor 240 and a second terminal of the capacitor 248. The gate of the transistor 240 can be coupled with the digital tuner 104 in order to receive the Bit2 signal.

Within FIG. 2, a second terminal of the capacitor 252 can be coupled with a first terminal of the resistor 254 and the source of the transistor 250. A second terminal of the resistor 254 can be coupled with a first terminal of the resistor 256 and can be coupled with the digital tuner 104 in order to receive the TBit0-bar signal. A second terminal of the resistor 256 can be coupled with the drain of the transistor 250 and a second terminal of the capacitor 258. The gate of the transistor 250 can be coupled with the digital tuner 104 in order to receive the TBit0 signal.

A second terminal of the capacitor 262 can be coupled with a first terminal of the resistor 264 and the source of the transistor 260. A second terminal of the resistor 264 can be coupled with a first terminal of the resistor 266 and can be coupled with the digital tuner 104 in order to receive the TBit6-bar signal. A second terminal of the resistor 266 can be coupled with the drain of the transistor 260 and a second terminal of the capacitor 268. The gate of the transistor 260 can be coupled with the digital tuner 104 in order to receive the TBit6 signal.

Within FIG. 2, note that each of the transistors 220, 230, 240, 250 and 260 can be implemented in a wide variety of ways. For example, each of the transistors 220, 230, 240, 250 and 260 can be implemented as, but is not limited to, a P-channel MOSFET (metal-oxide semiconductor field-effect transistor) which is also known as a PMOS or PFET. Furthermore, each of the transistors 220, 230, 240, 250 and 260 can be implemented as, but is not limited to, a N-channel MOSFET which is also known as a NMOS or NFET. It is appreciated that each of the transistors 220, 230, 240, 250 and 260 can be implemented as, but is not limited to, a PMOS, a NMOS, or any other type of transistor. Noted that each of the transistors 220, 230, 240, 250 and 260 can be referred to as a switching element. It is understood that a gate, a drain, and a source of a transistor can each be referred to as a terminal of its transistor. Additionally, the gate of a transistor can also be referred to as a control terminal of its transistor.

It is appreciated that the resonant tank circuit 200 may not include all of the elements illustrated by FIG. 2. Furthermore, the resonant tank circuit 200 can be implemented to include other elements not shown by FIG. 2. Moreover, the resonant tank circuit 200 may include fewer or greater number of binary coding capacitor unit cells (e.g., 270, 272, and 274) than those illustrated by FIG. 2. Additionally, the resonant tank circuit 200 may include fewer or greater number of thermometer coding capacitor unit cells (e.g., 276–278) than those illustrated by FIG. 2.

Figure 5:
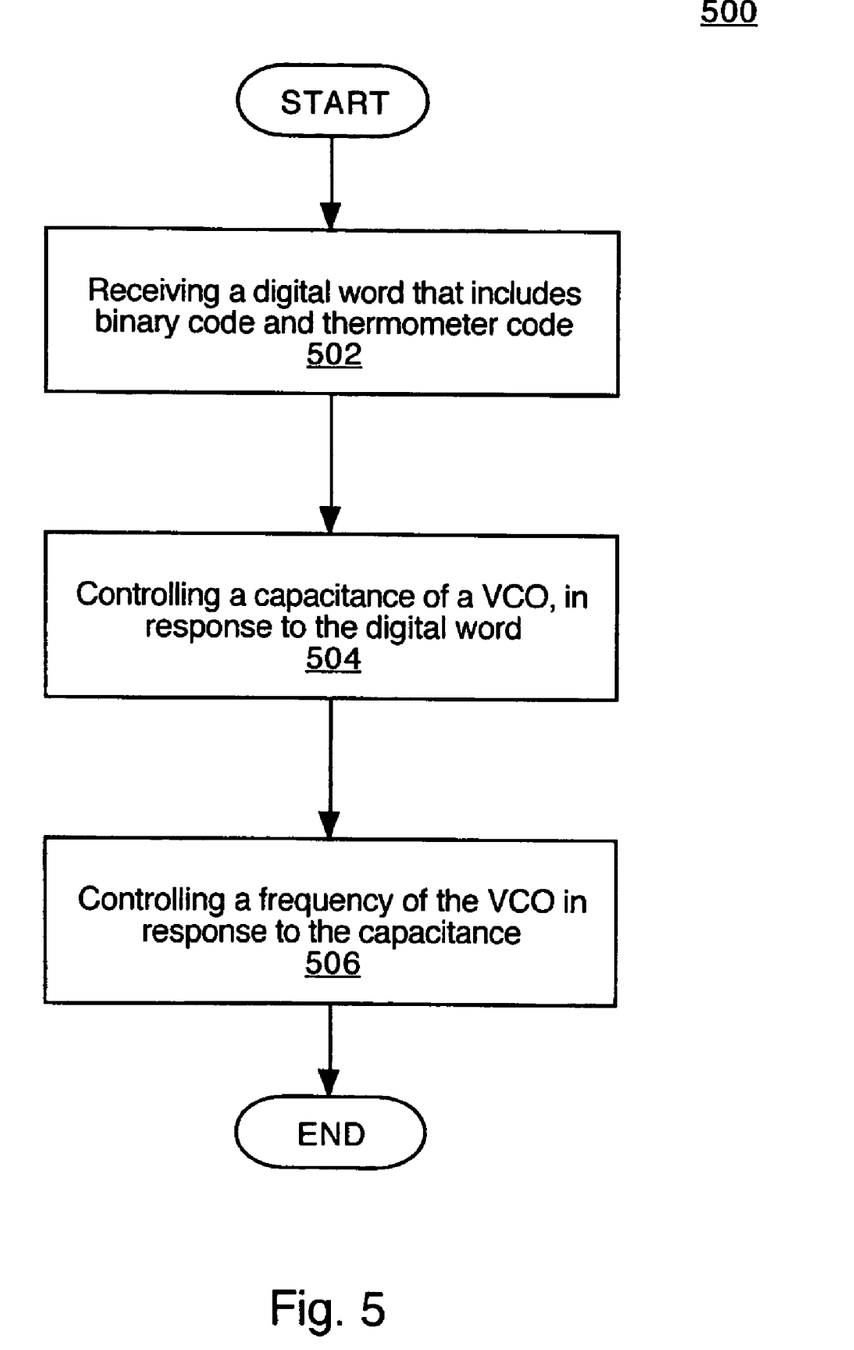
FIG. 5 is a flowchart of an embodiment directed towards a method for coarse frequency tuning.

FIG. 5 is a flowchart of a method 500 for controlling a frequency of a voltage controlled oscillator in accordance with embodiments. Although specific operations are disclosed in method 500, such operations are exemplary. That is, method 500 may not include all of the operations illustrated by FIG. 5. Alternatively, method 500 may include various other operations and/or variations of the operations shown by FIG. 5. Likewise, the sequence of the operations of method 500 can be modified. It is noted that the operations of method 500 can each be performed by software, by firmware, by electronic hardware, or by any combination thereof.

Specifically, the method 500 can include receiving a digital word that includes binary code and thermometer code. Additionally, the method 500 can include controlling a capacitance of a voltage controlled oscillator, in response to the digital word. Furthermore, the method 500 can include controlling a frequency of the voltage controlled oscillator in response to the capacitance of the voltage controlled oscillator.

At operation 502 of FIG. 5, the present embodiment can involve receiving a digital word that includes binary code and thermometer code. In one embodiment, the binary code of the digital word can address a plurality of capacitor tuning elements that increment in capacitive size by an approximate factor of 2. In another embodiment, the plurality of capacitor tuning elements includes a plurality of binary coding capacitor modules (e.g., 270, 272, and 274). In one embodiment, the thermometer code of the digital word can address a plurality of capacitor tuning elements that are each of substantially equal size. In another embodiment, the plurality of capacitor tuning elements includes a plurality of thermometer coding capacitor modules (e.g., 276 and 278). It is appreciated that the digital word at operation 502 can be implemented in a wide variety of ways. For example, the digital word can be implemented to include, but is not limited to, a combination of Bit0, Bit1, Bit2, TBit0, TBit1, TBit2, TBit3, TBit4, TBit5, and TBit6, as described herein. Note that the receiving of a digital word that includes binary code and thermometer code at operation 502 can be implemented in any manner similar to that described herein, but is not limited to such.

At operation 504, the present embodiment can involve controlling a capacitance of a voltage controlled oscillator (e.g., 100), in response to the digital word. In one embodiment, the controlling of the capacitance of the voltage controlled oscillator, in response to the digital word, can include activating or deactivating a capacitor tuning element (e.g., module 270 or 276) of a plurality of capacitor tuning elements (e.g., modules 270–276 and 278). It is appreciated that the plurality of capacitor tuning elements of operation 504 can be implemented in any manner similar to that described with reference to operation 502, but is not limited to such. Note that the controlling of a capacitance of a voltage controlled oscillator at operation 504, in response to the digital word can be implemented in any manner similar to that described herein, but is not limited to such.

At operation 506 of FIG. 5, the present embodiment can involve controlling a frequency of the voltage controlled oscillator (e.g., 100) in response to the capacitance. It is appreciated that operation 506 can be implemented in a wide variety of ways. For example, the controlling of a frequency of the voltage controlled oscillator at operation 506 in response to the capacitance can be implemented in any manner similar to that described herein, but is not limited to such.

Therefore, a LC resonant tank of a VCO in accordance with embodiments can confer a desirable tradeoff between silicon area consumption, design complexity, Q factor, and optimal tuning frequency coverage of the VCO. For example, by implementing the LC resonant tank with thermometer coded modules as its MSBs, each thermometer module capacitor size can be individually adjusted (or trimmed) away from its nominal unit value in order to provide a desired shift in the VCO frequency after taking into account layout parasitics. As such, this can result in easier optimization of the VCO tuning frequency range and coverage of the thermometer coded tuning while retaining the area and Q factor qualities of binary weighted tuning. Additionally, it can enhance the ease of designing the actual VCO.

The foregoing descriptions of specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A system comprising:
   a binary coding module of a voltage controlled oscillator; and
   a thermometer coding module coupled to said binary coding module, wherein said binary coding module and said thermometer coding module control a capacitance corresponding to a resonant tank of said voltage controlled oscillator for coarse frequency tuning of said voltage controlled oscillator.

2. The system of claim 1, wherein said resonant tank is coupled to receive a digital word for said coarse frequency tuning of said voltage controlled oscillator.

3. The system of claim 2, wherein said binary coding module is coupled to receive a least significant bit of said digital word.

4. The system of claim 2, wherein said thermometer coding module is coupled to receive a most significant bit of said digital word.

5. The system of claim 1, wherein said binary coding module comprises a capacitor coupled with a switching element.

6. The system of claim 1, wherein said thermometer coding module comprises a capacitor coupled with a switching element.

7. The system of claim 1, wherein said resonant tank comprises a varactor, wherein said binary coding module and said thermometer coding module are coupled with said varactor.

8. A method comprising:
   receiving a digital word comprising binary code and thermometer code;
   controlling a capacitance of a voltage controlled oscillator, in response to said digital word; and
   controlling a frequency of said voltage controlled oscillator in response to said capacitance.

9. The method as described in claim 8, wherein said binary code of said digital word addresses a plurality of capacitor tuning elements that increment in size by an approximate factor of 2.

10. The method as described in claim 9, wherein said plurality of capacitor tuning elements comprise a plurality of binary coding capacitor modules.

11. The method as described in claim 9, wherein said controlling said capacitance comprises activating a capacitor tuning element of said plurality of capacitor tuning elements.

12. The method as described in claim 8, wherein said thermometer code of said digital word addresses a plurality of capacitor tuning elements that are each of substantially equal size.

13. The method as described in claim 12, wherein said plurality of capacitor tuning elements comprise a plurality of thermometer coding capacitor modules.

14. The method as described in claim 12, wherein said controlling said capacitance comprises activating a capacitor tuning element of said plurality of capacitor tuning elements.

15. A system comprising:
   a binary coding capacitor module of an inductor-capacitor resonant tank of a voltage controlled oscillator; and
   a thermometer coding capacitor module coupled to said binary coding capacitor module, wherein said binary coding capacitor module and said thermometer coding capacitor module control a capacitance of said inductor-capacitor resonant tank for coarse frequency tuning of said voltage controlled oscillator.

16. The system of claim 15, wherein said inductor-capacitor resonant tank is coupled to receive a digital word for said coarse frequency tuning of said voltage controlled oscillator.

17. The system of claim 16, wherein said binary coding capacitor module is coupled to receive a least significant bit of said digital word.

18. The system of claim 16, wherein said thermometer coding capacitor module is coupled to receive a most significant bit of said digital word.

19. A circuit comprising:
   a varactor circuit;
   a binary coding capacitor module coupled in parallel with said varactor circuit; and
   a thermometer coding capacitor module coupled in parallel with said binary coding capacitor module.

20. The circuit of claim 19, wherein said binary coding capacitor module comprises:
   a first capacitor;
   a switching element coupled in series with said first capacitor;
   a second capacitor coupled in series with said switching element;
   a first resistor coupled to a first terminal of said switching element; and
   a second resistor coupled to a second terminal of said switching element and coupled to said first resistor.

21. The circuit of claim 19, wherein said thermometer coding capacitor module comprises:
   a first capacitor;
   a switching element coupled in series with said first capacitor;
   a second capacitor coupled in series with said switching element;
   a first resistor coupled to a first terminal of said switching element; and
   a second resistor coupled to a second terminal of said switching element and coupled to said first resistor.

22. The circuit of claim 21, wherein said binary coding capacitor module comprises:
   a first capacitor coupled to said first capacitor of said thermometer coding capacitor module;
   a switching element coupled in series with said first capacitor of said binary coding capacitor module;
   a second capacitor coupled in series with said switching element of said binary coding capacitor module and coupled to said second capacitor of said thermometer coding capacitor module;
   a first resistor coupled to a first terminal of said switching element of said binary coding capacitor module; and
   a second resistor coupled to a second terminal of said switching element of said binary coding capacitor module and coupled to said first resistor of said binary coding capacitor module.

* * * * *